(12) United States Patent
Sandstrom et al.

(10) Patent No.: US 11,444,051 B2
(45) Date of Patent: Sep. 13, 2022

(54) FULLY MOLDED SEMICONDUCTOR STRUCTURE WITH FACE MOUNTED PASSIVES AND METHOD OF MAKING THE SAME

(71) Applicant: Deca Technologies USA, Inc., Tempe, AZ (US)

(72) Inventors: Clifford Sandstrom, Richfield, MN (US); Benedict San Jose, Metro Manila (PH); Timothy L. Olson, Phoenix, AZ (US); Craig Bishop, Scottsdale, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/532,475

(22) Filed: Nov. 22, 2021

(65) Prior Publication Data

US 2022/0173067 A1    Jun. 2, 2022

Related U.S. Application Data

(60) Provisional application No. 63/119,923, filed on Dec. 1, 2020.

(51) Int. Cl.
*H01L 23/52* (2006.01)
*H01L 23/00* (2006.01)
*H01L 25/065* (2006.01)
*H01L 25/10* (2006.01)

(52) U.S. Cl.
CPC .......... *H01L 24/20* (2013.01); *H01L 25/0655* (2013.01); *H01L 25/105* (2013.01); *H01L 2224/2101* (2013.01); *H01L 2224/211* (2013.01); *H01L 2224/215* (2013.01)

(58) Field of Classification Search
CPC ............. H01L 24/20; H01L 2224/2101; H01L 2224/211; H01L 2224/215; H01L 25/0655; H01L 25/105
USPC ........................................................ 257/741
See application file for complete search history.

(56) References Cited

U.S. PATENT DOCUMENTS

| 8,354,297 B2 * | 1/2013 | Pagaila ............... H01L 25/0657 438/107 |
| 9,735,113 B2 * | 8/2017 | Chi ........................ H01L 21/561 |
| 9,773,757 B2 * | 9/2017 | Yu ........................... H01L 24/14 |

* cited by examiner

*Primary Examiner* — Luan C Thai
(74) *Attorney, Agent, or Firm* — Booth Udall Fuller, PLC; Bryce W. Burnham

(57) ABSTRACT

A semiconductor device, and method of making the same, comprising a plurality of conductive studs formed over an active surface of a semiconductor die. The plurality of conductive studs may be disposed around a device mount site, wherein the device mount site comprises conductive interconnects comprising a height less than a height of the plurality of conductive studs. An encapsulant may be disposed around the semiconductor die and the conductive studs. A portion of the conductive studs may be exposed from the encapsulant at a planar surface. A build-up interconnect structure comprising one or more layers may be disposed over and coupled to the planar surface, the conductive studs, and the conductive interconnect. A device may be coupled to the conductive interconnects of the device mount site.

20 Claims, 10 Drawing Sheets

FULLY MOLDED SEMICONDUCTOR STRUCTURE WITH FACE MOUNTED PASSIVES AND METHOD OF MAKING THE SAME

CROSS-REFERENCE TO RELATED APPLICATIONS

This disclosure claims the benefit, including the filing date, of U.S. Provisional Patent No. 63/119,923, entitled "Fully Molded Semiconductor Structure with Face Mounted Passives and Method of Making the Same," which was filed on Dec. 1, 2020, the disclosure of which is hereby incorporated herein by this reference.

TECHNICAL FIELD

This disclosure relates to a fully molded semiconductor structure with face mounted passives and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. More recently, back-end manufacturing has been expanded to included emerging technology that allows multiple semiconductor die to be interconnected within a single package or device unit, thereby expanding the conventional definition of back-end technology. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor manufacturing and devices. Accordingly, in an aspect of the disclosure, a semiconductor device may comprise a semiconductor die disposed over a first build-up interconnect structure with copper posts disposed around a perimeter of the semiconductor die. A plurality of copper studs may be formed over an active surface of the semiconductor die, the plurality of copper studs being disposed around a passive mount site, wherein the passive mount site comprises copper interconnects comprising a height less than a height of the plurality of copper studs. An encapsulant may be disposed around the copper posts, the semiconductor die, and the copper studs, wherein a portion of the copper posts and the copper studs are exposed from the encapsulant at a planar surface. A second build-up interconnect structure comprising one or more redistribution layers may be disposed over and coupled to the planar surface, the copper posts, and the copper studs. Electrical interconnects may be coupled to the second build-up interconnect structure. A passive device may be coupled to the copper interconnects of the passive mount site.

Particular embodiments of the semiconductor device may further comprise a plurality of semiconductor die in a chiplet arrangement, the chiplet further comprising semiconductor die comprising one or more of: a CPU, a modem, a GPU, AI processor, IO devices, SERDES devices, and a memory device. The copper interconnects may comprise a height in a range of 2 to 20 micrometers, and the copper studs may comprise a height in a range of 5 to 300 micrometers. A footprint of the plurality of copper studs may surround the passive mount site. The copper interconnects may further be formed to comprise one or more bump, ball, flip chip structure, or copper pillar bump comprising one or more of solder, solderless material, polymer conductive film, and carbon. The passive device may further comprise an integrated passive, resistor, capacitor, inductor, integrated passive device (IPD), multilayer ceramic capacitor (MLCC), semiconductor die, or a voltage regulator. The passive device may be directly attached to the copper interconnects of the passive mount site.

According to an aspect of the disclosure, a semiconductor device may comprise a plurality of conductive studs formed over an active surface of a semiconductor die. The plurality of conductive studs may be disposed around a device mount site. The device mount site may comprise conductive interconnects comprising a height less than a height of the plurality of conductive studs. An encapsulant may be disposed around the semiconductor die and the conductive studs. A portion of the conductive studs may be exposed from the encapsulant at a planar surface. A build-up interconnect structure may comprise one or more layers disposed over and coupled to the planar surface, the conductive studs, and the conductive interconnects. A device may be coupled to the conductive interconnects of the device mount site.

In other aspects, particular embodiments of the semiconductor die may comprise a plurality of semiconductor die in a chiplet arrangement, the chiplet further comprising semiconductor die comprising one or more of: a CPU, a modem, a GPU, AI processor, IO devices, SERDES devices, and a memory device. The conductive interconnects may comprise a height in a range of 2 to 20 micrometers. The conductive studs may comprise a height in a range of 5 to 300 micrometers. An underfill may be disposed around the device mount site to provide structural support and environmental protection for the passive device. A footprint of the plurality of conductive studs may surround the device mount site. The conductive interconnects may comprise forming one or more bump, ball, flip chip structure, or conductive pillar bump comprising one or more of solder, solderless material, polymer conductive film, and carbon. The device may further comprise an integrated passive, resistor, capacitor, inductor, IPD, a multilayer ceramic capacitor MLCC, a semiconductor die, or a voltage regulator. The device may be directly attached to the conductive interconnects of the device mount site.

According to an aspect of the disclosure, a semiconductor device may comprise a plurality of conductive studs formed over an active surface of a semiconductor die. The plurality of conductive studs may be disposed around a device mount site, wherein the device mount site comprises conductive interconnects comprising a height less than a height of the plurality of conductive studs. Encapsulant may be disposed around the semiconductor die and the conductive studs. A portion of the conductive studs may be exposed from the encapsulant. A build-up interconnect structure may comprise one or more conductive layers disposed over and coupled to the conductive studs. Electrical interconnects may be coupled to the build-up interconnect structure. A device may be coupled to the conductive interconnects of the device mount site.

In other aspects, particular embodiments of the semiconductor device may comprise the semiconductor die comprising a plurality of semiconductor die in a chiplet arrangement. The chiplet may further comprise semiconductor die comprising one or more of: a CPU, a modem, a GPU, AI processor, IO devices, SERDES devices, and a memory device. The conductive interconnects may comprise a height in a range of 2 to 20 micrometers. The conductive studs may comprise a height in a range of 5 to 300 micrometers. A footprint of the plurality of copper studs or conductive studs may surround the device mount site. The device may further comprise an integrated passive, resistor, capacitor, inductor, IPD, or a MLCC, a semiconductor die or a voltage regulator. The device may be directly attached to the conductive interconnects of the device mount site.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

DETAILED DESCRIPTION

Figure 1A:
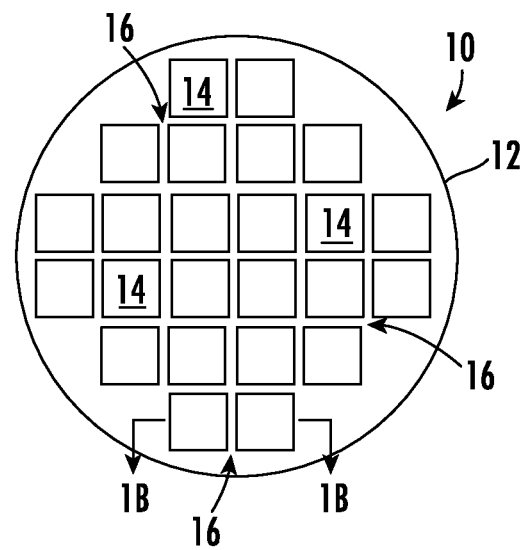
FIGS. 1A-1G illustrate semiconductor die from a native wafer comprising electrical interconnects.

This disclosure relates to fully molded semiconductor structures, devices, and packages, and more particularly to fully molded semiconductor structures with face mounted passives and methods of making the same. In some instances, the fully molded semiconductor structures may comprise vertical interconnects and backside redistribution layers or build-up interconnect structures for package on package (PoP) applications.

The semiconductor structures can comprise a plurality of fully molded or encapsulated semiconductor die in die-up (face-up) positions, die-down (face-down) positions, or both. Face-down implementations may be advantageously used with a mounting tape or soft mounting tape. As used herein, die-up refers to a semiconductor die comprising an active surface and a back surface opposite the active surface that is positioned or oriented such that the back surface is coupled to, and oriented towards, a carrier, substrate, reconstituted wafer, or molded panel, wafer, sacrificial wafer fan-out wafer or panel, embedded die panel, or derivatives thereof, whether temporary or permanent, of any size of shape (hereinafter carrier). The active surface of the semiconductor die can be oriented away from the carrier when the semiconductor die is mounted to the carrier. As used herein, die-down refers to a semiconductor die comprising an active surface and a back surface opposite the active surface that is positioned such that the active surface is coupled to, and oriented towards, the carrier and the back surface of the semiconductor die is oriented away from the carrier when the semiconductor die is mounted to the carrier.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography. Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. Alternatively, some types of materials are patterned by directly depositing material into the areas or voids formed by the photoresist or by a previous deposition/etch process using techniques such as electroless and electrolytic plating. The chemistry of photoresists is such that the photoresist remains substantially intact and resists removal by chemical etching solutions or plating chemistries while the portion of the top layers of the semiconductor wafer not covered by the photoresist is removed or is added to by plating. The process of forming, exposing, and removing the photoresist, as well as the process of removing a portion of the semiconductor wafer or adding to a portion of the wafer can be modified according to the particular resist used and the desired results.

Cutting or singulating a finished wafer into the individual semiconductor die and then packaging the semiconductor die allows for subsequent electrical interconnections and related structure to be built around the die, as well as for structural support and environmental isolation or protection of the semiconductor die. To singulate the semiconductor die, the wafer can be cut along non-functional regions of the wafer called saw streets or scribes. The wafer is singulated using a laser cutting tool or saw blade. After singulation, the individual semiconductor die may be temporarily placed on a temporary carrier or substrate to provide structural support for additional processing and packaging, as indicated above. Contact pads, studs, and other electrical interconnects may be formed over the semiconductor die are then connected to other features or structures within the final package. The electrical connections can be made with conductive layers, bumps, redistribution layers, or other desirable features. An encapsulant or other molding material is deposited over the package to provide physical support, stability, and electrical isolation. The finished package may then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a portable hand-held electronics device, such as smart phone, a wearable electronic device, or other video or electronic communication device. Additionally, the electrical system may comprise a graphics component, network interface component, or other signal processing component that can be inserted into a computer or electronics device and may assist with such functions as mobile computing, artificial intelligence, and autonomous functions such as autonomous driving. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor devices, structures, or packages with fan-out technology, manufacturers can incorporate multiple components or elements into more highly compact and integrated electronic devices and systems. Because the semiconductor devices include sophisticated functionality, electronic devices can be manufactured less expensively and as part of a streamlined manufacturing process. The resulting devices are less likely to fail and less expensive to manufacture resulting in a lower cost for consumers.

FIGS. 1A-1G, illustrate a process flow, treatments, or steps, that may be applied as panelized or wafer level packaging for finished or completed semiconductor die, whether the completed semiconductor die are part of a native wafer or are part of a reconstituted fan-out format. The packaging of the embedded devices or semiconductor die may comprise face mounted passives. As used herein, a "passive" or "passive device" may comprise an integrated passive, resistor, capacitor, inductor, integrated passive device (IPD), or a multilayer ceramic capacitor (MLCC). The fully molded semiconductor structures with face mounted passives disclosed herein comprise embedded devices 14, which comprise semiconductor die singulated from a native semiconductor wafer, active devices, a semiconductor chip or chip, a bridge chip containing only routing layers without an active device, an integrated passive device (IPD), and a passive device. When the description refers to any of the above cited exemplary embedded devices, it is to be understood that any of the other embedded devices may also be used.

FIG. 1A illustrates a plan view of a semiconductor wafer or native wafer 10 with a base substrate material 12, such as, without limitation, silicon, germanium, gallium arsenide, indium phosphide, or silicon carbide, for structural support. A plurality of semiconductor die, components, or embedded device 14 can be formed on wafer 10 separated by a non-active, inter-die wafer area or saw street 16 as described above. The saw street 16 can provide cutting areas to singulate the semiconductor wafer 10 into the individual semiconductor die 14.

Each semiconductor die 14 may comprise a backside or back surface and an active surface opposite the backside. The active surface contains one or more analog, passive, or digital circuits implemented as active devices, passive devices, conductive layers, and dielectric layers formed within the die and electrically interconnected according to the electrical design and function of the semiconductor die. For example, the circuit may include one or more transistors, diodes, and other circuit elements formed within active surface to implement analog circuits or digital circuits, such as DSP, ASIC, memory, or other signal processing circuits. The semiconductor die may also contain IPDs such as inductors, capacitors, and resistors, for RF signal processing. The semiconductor die 14 may be formed on a native wafer in a wafer level process as one of many packages being formed simultaneously on a carrier. In other instances, the semiconductor die 14 may be formed as part of a reconstituted wafer, and may comprise multiple die molded together.

Figure 1B:
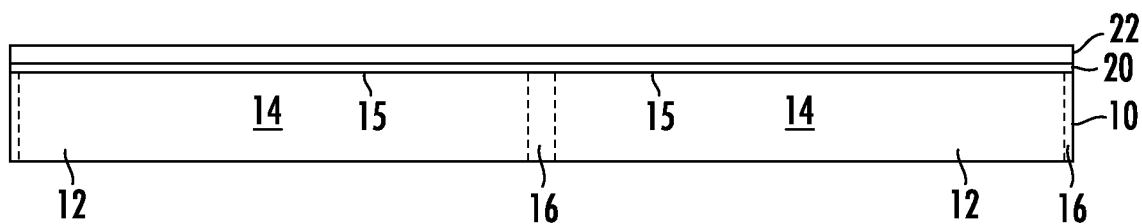

FIG. 1B, illustrates a cross-sectional profile view of the wafer 10 which includes semiconductor die 14. The wafer may comprise of thickness (shown in the side view as the vertical dimension on the page) of about 130-500 μm, or about 700-850 μm, or about 775 μm, and may be of any desirable thickness. As used herein "about" and "approximately" mean within a percent difference of less than or equal to 50%, 40%, 30%, 20%, 10%, 5%, 3%, 2%, or 1%. A seed layer 20 may be formed over the wafer 10, the seed layer being of any suitable conductive material or metal, such as titanium (Ti) and copper (Cu). A photoresist layer 22 may be formed over the seed layer 20 and over the wafer 10. The photoresist layer 22 may have of thickness of, or about, 15 μm.

Figure 1C:
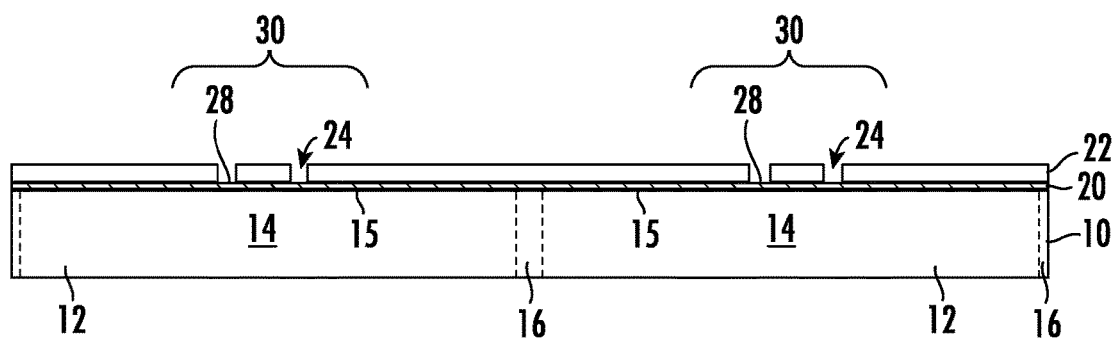

As illustrated in FIG. 1C, the photoresist layer 22 may be patterned to include openings 24 in the photoresist layer 22 may be formed for conductive interconnects 28 like copper, nickel gold, or other conductive interconnects that are formed over semiconductor die (such as while the semiconductor die 14 are part of a native wafer 10), the conductive interconnects 28 may be formed, or disposed, at device mount sites 30 (including passive mount sites) that will later receive devices 32 (whether passive devices 34 or active devices 36) mounted to, or over, the active surfaces 15 of the semiconductor die 14. As such, while only two side by side device mount sites 30 and corresponding openings 24 are shown by way of illustration in the cross-section profile views, it is hereby expressly disclosed that multiple device mount sites 30 may be formed across the face of the wafer 10 for each of a plurality of semiconductor die 14 within the panel 10. In some cases, single devices or semiconductor die 14 may include a plurality of device mount sites 30, such as two, three, or more device mount sites 30 for a single semiconductor die or active device 14.

The devices 32 subsequently mounted to, or disposed within, the device mount sites 34 may comprise passive devices 34 comprising an integrated passive, resistor, capacitor, inductor, integrated passive device (IPD), or a multilayer ceramic capacitor (MLCC). The devices 32 subsequently mounted to, or disposed within, the device mount sites 30 may also comprise active devices 36 comprising semiconductor die 14 and voltage regulators.

FIG. 1C also illustrates the conductive interconnects or interconnects 28, which comprise copper interconnects, being formed or plated within the openings 24 in the photoresist layer 22. A height of the interconnects 28 may be, or may be about, 2-20 μm, 5-15 μm or 7 μm. The conductive interconnects 28 will be used for subsequently connecting, coupling to, or having mounted thereon the device 30. After the formation of the conductive interconnects 28, the photo resist layer 22 may be removed by a resist strip or other suitable process, the photoresist 22 being removed or stripped from the wafer 10, and the conductive interconnects 28 and the conductive seed layer 20 being left in place over the wafer 10.

Figure 1D:
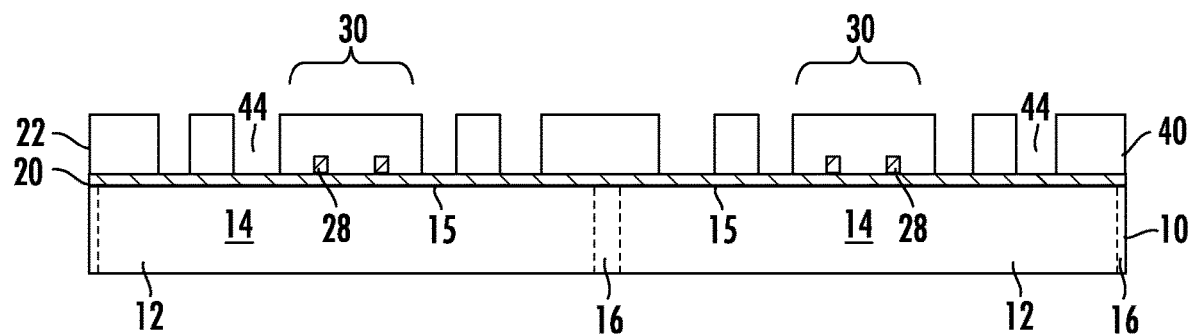

FIG. 1D illustrates a new, another, or second photoresist layer 40 formed over the seed layer 20 and the conductive interconnects 28, with a thickness or height of the second photoresist layer 40 being greater than a height of the conductive interconnects 28. The second photoresist layer 40 may comprise a thickness of, or about, 56 μm, such as in a range of 50-60 μm, 40-60 μm, or 20-70 μm. The second photoresist layer 40 may be formed so as to be taller or slightly taller than the conductive interconnects or copper studs 28, so as to be surrounded by, or encapsulated with, the photoresist 40. As such the conductive interconnects 28 may be disposed within the mold, and subsequently the photoresist 40, and then be later revealed or exposed from a subsequently formed encapsulant or mold compound, including. an electronic molding compound (EMC) and PBO, such as through a topgrind of the encapsulant.

FIG. 1D also illustrates the second photoresist 40 being exposed and developed to form openings or second openings 44 for a plurality of studs or copper studs 46 over the active surface 15 of the semiconductor die 14, the plurality of studs or copper studs 46 being disposed around (or in a periphery of) the device mount site 30 and the conductive interconnects 28. After formation of the openings 44, the formation or plating of the conductive studs 46 can occur within the openings 44. The conductive studs 46 may comprise a height of, or about, 48 μm, such as in a range of 40-50 μm, or 20-70 μm.

Figure 1E:
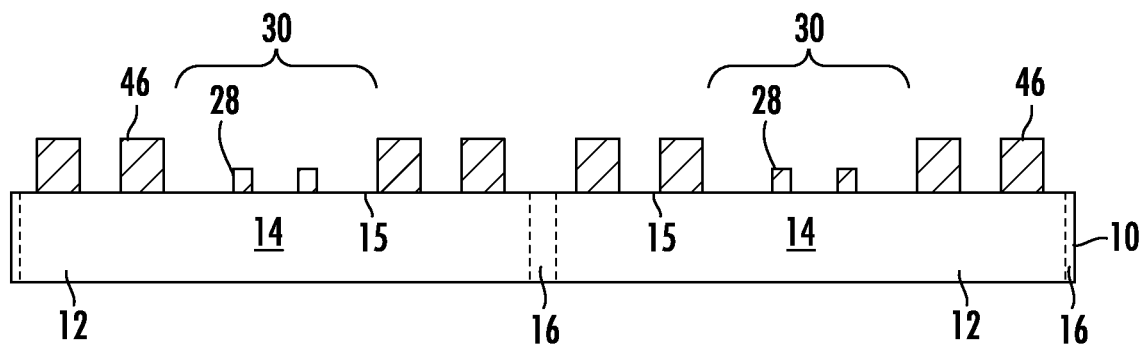

FIG. 1E illustrates removal or resist strip of the second photoresists layer 40, and etching or removing the seed layer 20 from over the wafer 10 outside a footprint of the conductive interconnects 28 and studs 46.

Figure 1F:
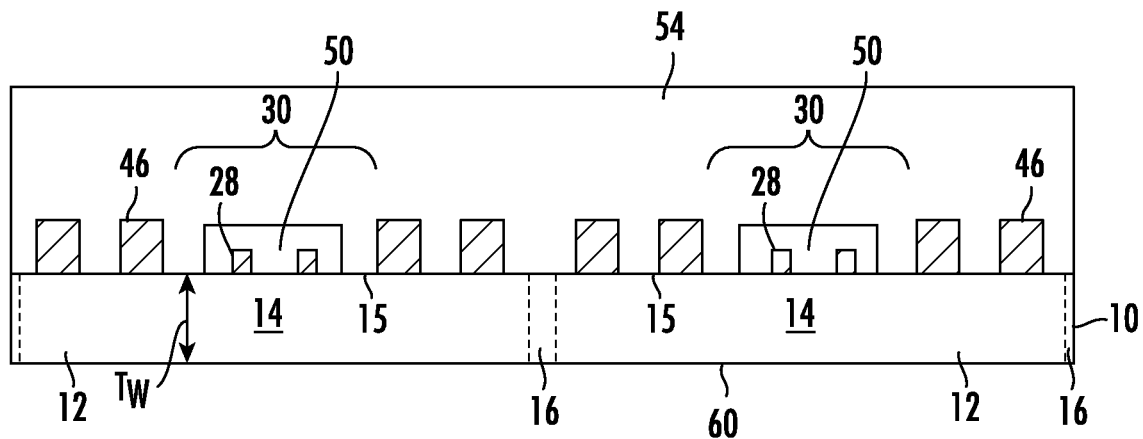

FIG. 1F illustrates, after the processes of FIG. 1E, a portion of a process for providing a cavity formation film (CFF) 50 over the device mount site 30 that covers the conductive interconnects 28, and leaves the studs 46 exposed. Providing the CFF 50 may begin with forming another or third photoresist layer of over the wafer 10 and then subsequently patterning and removing a portion of the photoresist. The portion of the photoresist may be removed to expose the studs 46 and to keep the device mount site 30 covered to preserve a space or volume for the yet-to-be mounted device at the mount site during a subsequent encapsulating phase, as shown and discussed below, for example, in FIG. 2B. However, other suitable materials and processes may also be used to form the CFF 50 to keep the mount site 30 covered to preserve a space of volume for the mount site 30 during the subsequent encapsulating phase. In some instances, and as shown for example in FIG. 2C, the cavity for the passive mount site 30 may comprise a height or depth of, or about, 57 um, which may be the sum of the heights of the build-up layer plus the height of the copper stud (e.g., 25 um plus 32 um).

FIG. 1F also illustrates a backgrind (BG) tape laminate 54 applied over the active surface 15 of the wafer 10, over the studs 46 and over the CFF 50. After applying BG tape 54, the wafer 10 may be thinned through a backgrinding process to a thickness of about 100 μm by removing material from a backside of the wafer 10 opposite the backgrind tape 54, so as reduce a height and overall package profile.

Figure 1G:
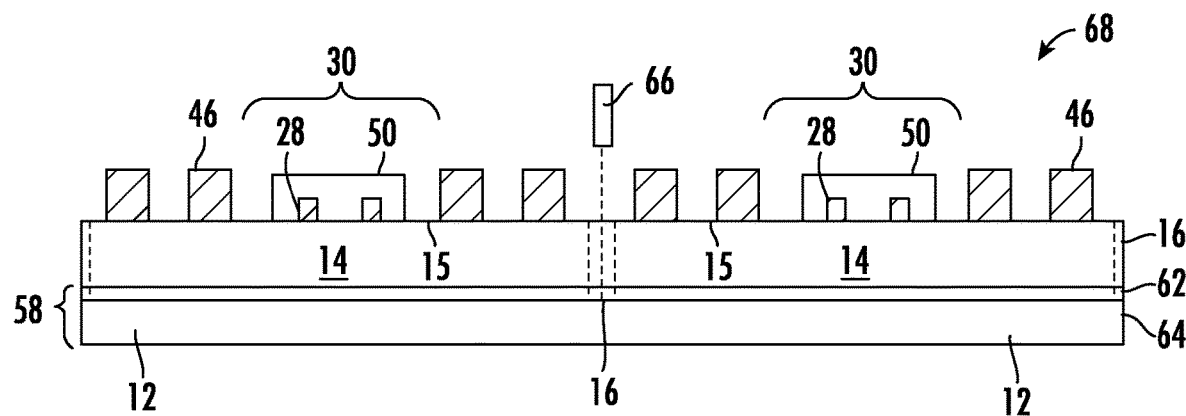

FIG. 1G illustrates that after backgrinding the wafer 10, a two-in-one (2-in-1) tape 58 (or multiple single layer materials or tapes) may be applied over the backside or thinned backside 60 of the wafer 10. The 2-in-1 tape 58 may comprise a first layer that is a die attach film (DAF) and a second layer that is a saw tape 64 coupled to, or disposed over the DAF 62. The DAF 62 may be a layer comprising a thickness in a range of or about 5 μm-50 μm, and include, for example, about, 10 μm, wherein the DAF 62 may be laminated to the backside 60 of the semiconductor die 10 to become a part of the final package or device, as shown, e.g., in FIGS. 2D, 2E, 3A, and 3B. Additionally, the second layer or saw tape 64 may be coupled to the DAF 62, and as such, may be applied with the DAF 62 to the semiconductor die or embedded device 14 to help facilitate later sawing or singulation of the wafer 10 into individual semiconductor die 14.

FIG. 1G also illustrates that after the backgrinding of the wafer 10 and the placement of the tape 58 (or one or more of DAF 62 and saw tape 64) over the backside 60, BG tape 54 may be removed. BG tape 54 may be removed in any desirable or suitable way, including by being exposed to ultraviolet (UV) light or radiation. After the removal of BG tape 54, the wafer 10 may be singulated, such as by a laser or wafer saw 66 that extends completely through the wafer and through the DAF 62, after which a die expander may stretch the saw tape 64 to expand a spacing between the semiconductor die 14 and the newly formed die units or device units 68 for later removal from the saw tape 64, such as in a pick and place operation.

Figure 2A:
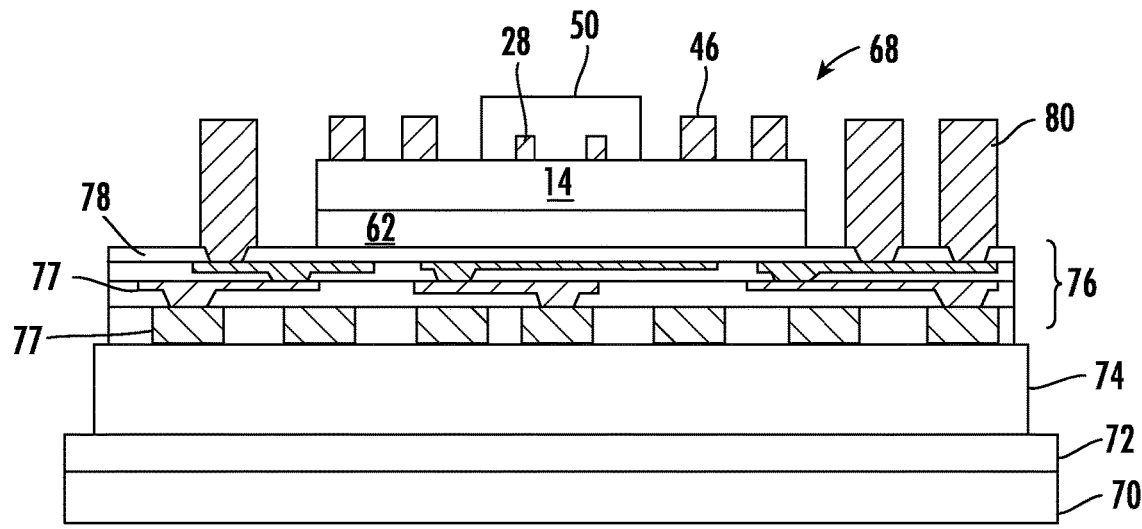
FIGS. 2A-2F illustrate the formation of fully molded semiconductor structure with face mounted passives.

FIG. 2A, continuing from FIG. 1G, illustrates the die unit 68 being incorporated into part of a larger structure. Die units may be formed at a panel level or with multiple units 68 spread in an array across a carrier 70 to provide additional structure and packaging for the die unit 68. The additional structure may, e.g., be used for package on package (PoP) structures, vertical integration, chiplets, further integration, or other suitable design, examples of which are illustrated and discussed with respect to subsequent FIGs. The carrier 70 may be a standard metal carrier, as well as a glass carrier, or a carrier comprising one or more of ceramic, silicon, composite, including composites of silicon and mold compound, a disposable or grindable carrier, or any other suitable type of carrier. An adhesive or adhesion layer 72, including a tape such as a Revalpha™ tape, may be formed over the carrier 70 to provide adhesion for subsequently formed layers and for the later removal of the carrier 70.

A temporary carrier or substrate material 74 may be disposed over, and coupled to, the adhesive 72 and carrier 70. The temporary carrier 74 may be composed of different kinds of glass, ceramic, a semiconductor wafer, or a composite of a wafer and EMC or base substrate material such as, without limitation, silicon, germanium, gallium arsenide, indium phosphide, or silicon carbide, for structural support. The temporary carrier 74 may comprise through vertical interconnects, electrical routing, through silicon vias, embedded devices, or other desirable features. The temporary carrier 74 may also be a temporary or sacrificial carrier of ceramic, silicon, composite, including composites of silicon and mold compound, a disposable or grindable carrier, or any other suitable type of carrier that can be removed to expose at least a portion of the subsequently formed lower or backside build-up interconnect structure 76.

The build-up interconnect structure 76 may be formed over the temporary carrier 74, and the build-up interconnect structure 76 may comprise one or more conductive layers 77, including: one or more redistribution layers (RDL layers), via layers, RDL pads, and under bump metallization (UBM) layers, interleaved with, adjacent, or formed next to insulating, passivating, or dielectric layers 78. As used herein, an RDL layer may comprise a conductive layer that provides routing or distribution of electrical signals, power, or current, in a vertical direction, a lateral direction, or both. As such, an RDL may include, but it not required to include, lateral offset of distribution. After formation of the build-up interconnect structure 76 over the temporary carrier 74, the die unit 68 may be mounted to the build-up interconnect structure 76 after the die unit 68 is removed from saw tape 64 (as shown in FIG. 1G) such as with a heated chuck for heating the DAF 62 for release of the die unit 68.

Posts, vertical package interconnects or vertical device interconnects 80 may be formed of conductive material in a periphery or around a perimeter of the die units 68 to provide for vertical electrical interconnect through the backside or lower built-up interconnect structure 76 and connect to (or with) a later formed active side or front side build-up interconnect structure 86. The posts 80 being in a periphery or around a perimeter of the die units 68 does not require that the posts 80 be disposed completely or totally around an entire perimeter of the semiconductor die, so as to complete a 360 degree revolution. The posts 80 may be disposed around a portion less than entirety (or 360 degree revolution around) the die units 68, such as being disposed along only 1 side, 2 sides, 3 sides, or any desirable number of sides of the die units 68, and would still be disposed in a periphery or around a perimeter of the die units 68, as used herein.

Figure 2B:
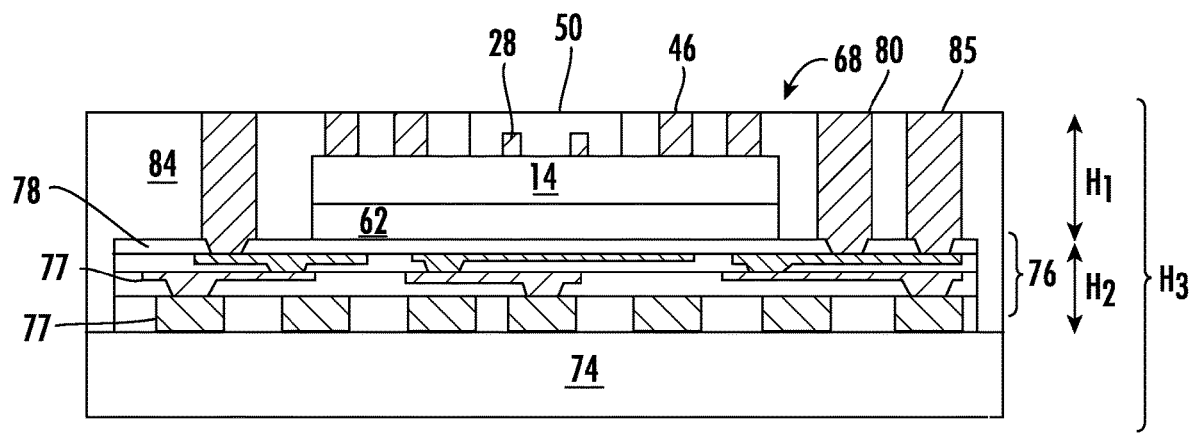

FIG. 2B, continuing from FIG. 2A, illustrates the placement of an encapsulant or mold compound 84. The encapsulant 84 can be deposited around the one or more semiconductor die 14 using a paste printing, compression molding, transfer molding, liquid encapsulant molding, lamination, vacuum lamination, spin coating, or other suitable applicator. The mold compound 84 can be a polymer composite material, such as epoxy resin with filler, epoxy acrylate with filler, PBO, polyimide, polymer with or without proper filler. In some instances, the encapsulant 84 may be used to form a reconstituted panel, reconstituted wafer, molded panel, or molded wafer 58. Semiconductor die 14 can be embedded in the mold compound 84, which can be non-conductive and environmentally protect the semiconductor die 14 from external elements and contaminants, provide structural support, and provide electrical isolation or insulation. The mold compound 84 can be formed adjacent to and directly contact all lateral sides of the semiconductor die (such as four sides), as well as be formed over a portion of the active surface 15 of the semiconductor die 14, but not including the portion of the active surface 15 and the conductive interconnects 28 covered by the CFF 50. The mold compound 84 can also be formed around and directly contact the sides of the studs 46 and the posts or vertical package interconnects 80.

The encapsulant 84 can optionally undergo a curing process or post mold cure (PMC) to cure the encapsulant 84. In some instances, a top surface, front surface, or first surface 85 of the mold compound 84 can be substantially coplanar with ends of the studs 46 and the posts 80. The surface 85 of the encapsulant 84 can be initially formed to be planar with the studs 46 and the posts 80, or may undergo a subsequent grinding or removal process so as to planar with the studs 46 and the posts 80. After formation, placement, or positioning of the encapsulant 84, the carrier 70 and the adhesive 72 may be debonded from temporary carrier 74.

In FIG. 2B, a height of die unit 68 is shown as $H_1$, a height of build-up interconnect structure 76 is shown as $H_2$, and a height of die unit 68 ($H_1$) plus height of build-up interconnect structure 76 ($H_2$) is shown as $H_3$. $H_3$ can be at, or about, 40 μm-250 μm, or about 80 μm-130 μm.

Figure 2C:
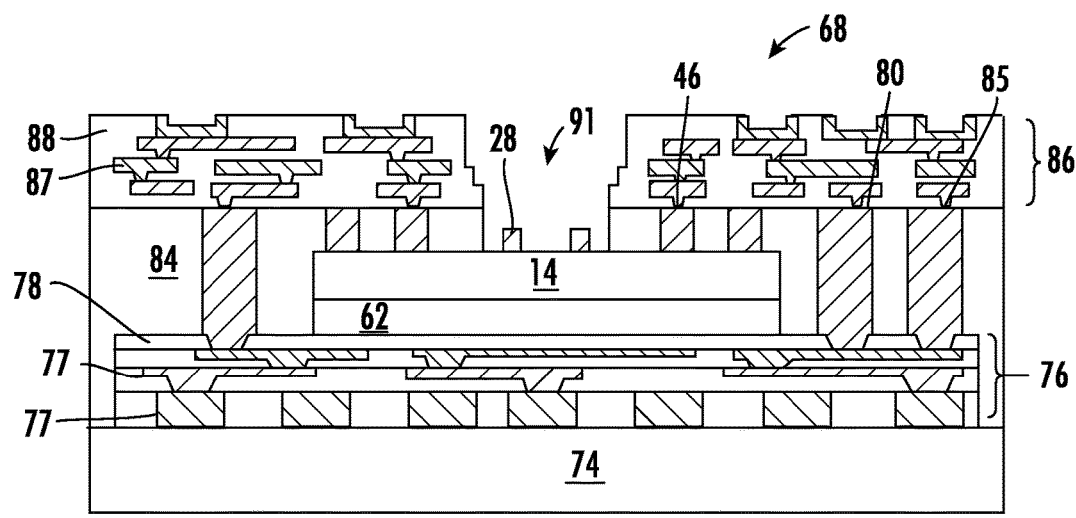

FIG. 2C, continuing form FIG. 2B, illustrates the encapsulant 84 after topgrind to arrive at a final device or package thickness. FIG. 2C also illustrates providing additional structure and packaging for the same, which may, e.g., be used for package on package (PoP) structures or other further integration. FIG. 2C further shows removal of the CFF 50, with an IPD strip, chemical strip, or plasma. A copper rinse, a plasma clean, or both, may also be used to clean the conductive interconnects 28 within the device mount site 30 and in the cavity 91 after the CFF 50 is removed. The cavity 91 may correspond in size or volume equal to a size or volume of the CFF 50, and may also further comprise or size or volume greater than the volume of the CFF and further include a volume of a gap, space, or opening in a build-up interconnect structure 86 as shown in FIG. 2C. The cleanings may advantageously remove copper oxide from the conductive interconnects or copper interconnects 28 to which the device 90 will be mounted or directly attached.

Further, removal of the CFF 50 may be advantageously removed before formation of the active side, front side, or second, build-up interconnect structure 86, to facilitate removal of all the CFF 50 and to prevent the CFF 50 from undergoing the thermal cures used in formation of the build-up interconnect structure 86, which may make the CFF 50 more difficult to subsequently remove. In some instances, the thermal cure(s) of the build-up-interconnect structure 86 may comprise temperatures>160° C., such as at or about 175° C. or greater than 175° C. during post mold cure (PMC), whereas the CFF 50 may experience lower temperatures during encapsulation or placement of encapsulant 84, such as at or about 150° C. during an in-mold cure.

FIG. 2C also illustrates the active side build-up interconnect structure 86 may comprise one or more conductive or RDL layers 87, such as including: PVia1, RDL1, PVia2, RDL2, PVia3, RDL3, PUBV and a UBM. The build-up interconnect structure 86 may also comprise one or more insulating, passivating, or dielectric layers 88 that are interleaved with, disposed around, or alternating with the conductive layers 87. A copper (Cu) rinse may follow the formation of the build-up interconnect structure.

Figure 2D:
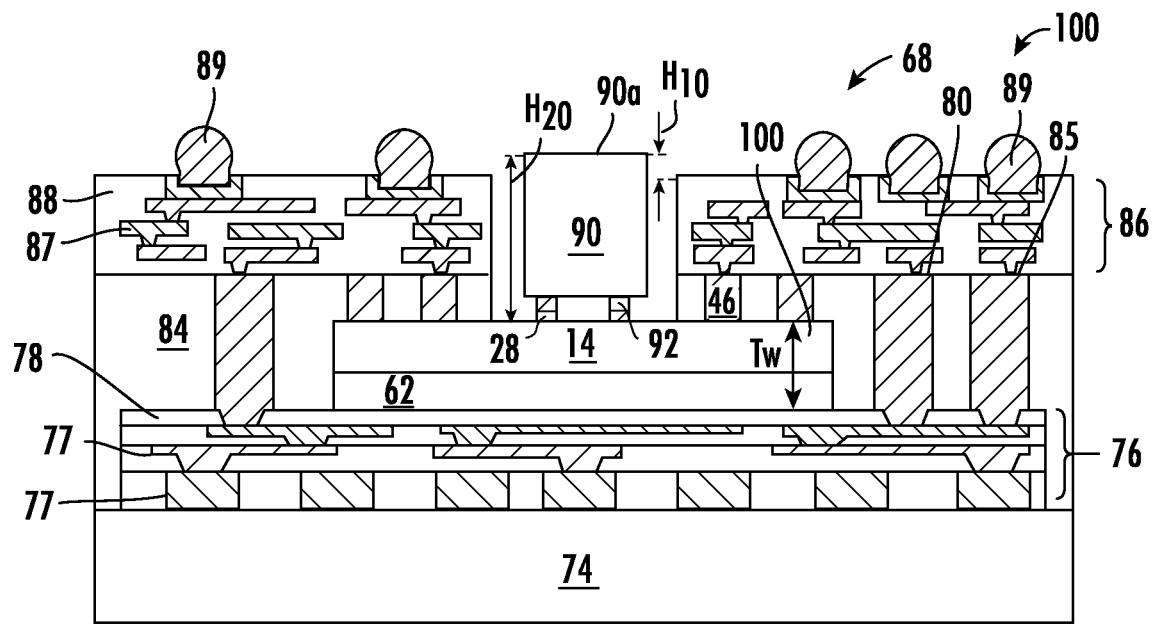

FIG. 2D illustrates electrical interconnects 89, which may include bumps or balls, being formed on, or as part of, the semiconductor device or package 100, such as by a ball attach. Forming the electrical interconnects 89 may comprise forming one or more bump, ball, flip chip structure, or copper pillar bump comprising one or more of solder, solderless material, polymer conductive film, and carbon.

FIG. 2D also illustrates coupling a device 90, which may be an active device or a passive device, to the conductive interconnects 28 and within cavity 91 at the device mount site 30. When the device 90 is a passive device, the passive device may comprise an integrated passive, resistor, capacitor, inductor, integrated passive device (IPD), or a multilayer ceramic capacitor (MLCC). When an active device, the active device may comprise a semiconductor die or a voltage regulator, or other suitable device.

The processing included at FIG. 2D may further include one or more reflows or solder reflows, in which the electrical connects 89 for the package or device 100 (e.g., ball attach) and the device attach of device 90 (e.g. an IPD attach) may happen in a same step, or in more than one step, such as in two different steps. In some instances, the electrical interconnects 89 may be formed as solder balls (or other desirable electrical interconnect) and be attached first. Then, after attaching the electrical interconnects 89, the device 90 may then be coupled to the device mount site 30 and conductive interconnects 28, wherein the device mount happens as part of a second or different process. In some instances, the bonding may be formed for the device 90 at the device mount side 30 with the conductive interconnects 28 being part of copper to copper bonding, or bonding with solder, or in any other suitable way.

Alternatively, the electrical connects 89 for the package or device 100 (e.g., ball attach) and the device attach (e.g. an IPD attach) may happen in a same step, such as with a single reflow. In such an instance, the device 90, e.g. an IPD, may be attached to the device mount site 30 and conductive interconnects 28 after the flux and solder stenciling happens for the bumps or electrical interconnects 89 for the device or package 100. Bonding may also include a metal to metal bond (e.g. copper to copper) without solder. In some instances, the device 90 coupled to the device mount site 30 may be an IPD comprising another metal on it, to help or assist in bonding. While any suitable device 90 may be directly attached to the embedded device 14, typical devices 90 may comprise multi-layer ceramic capacitors, discrete devices, IPD of silicon, inductors for RF, resistors, or any passive. By forming the device 90 directly attached to the active device or semiconductor die 14, high value inductors, such as inductors in a range of 1 nanohenry to 1 microhenry, may advantageously be used. Decoupling capacitors with a capacitance in a range of 10 nanofarads to 1 microfarad may also be advantageously used.

Figure 2E:
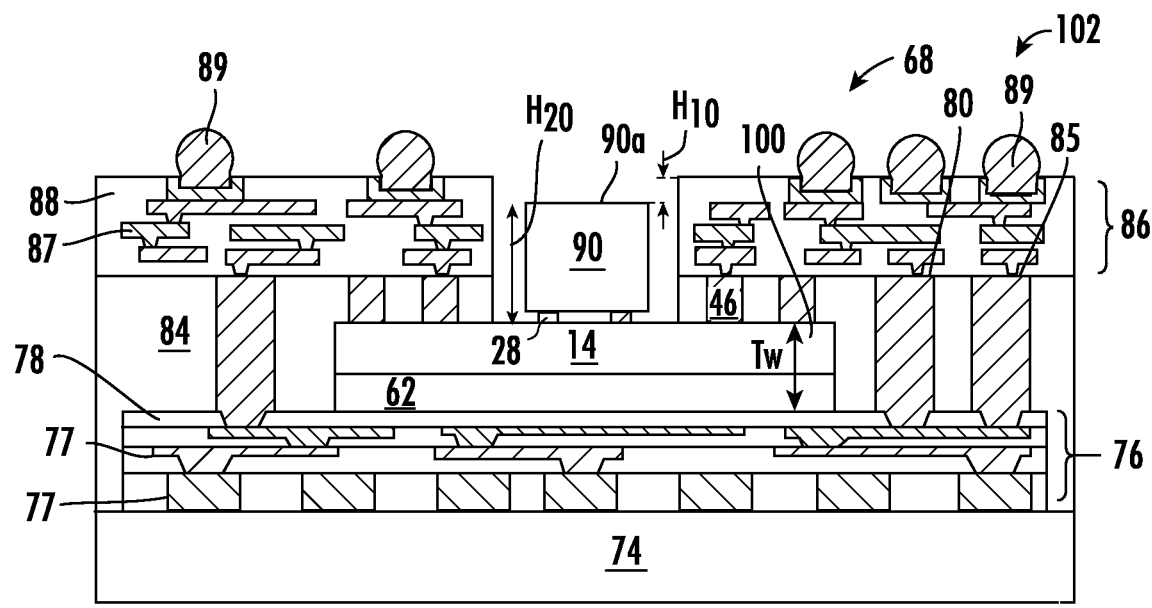

FIGS. 2D-2E illustrate various embodiments of fully molded semiconductor structures 100, 102 with face mounted devices 90 coupled thereto, which may result from the process shown in FIGS. 1A-2C. FIG. 2D illustrates an instance in which the device 90 (e.g., an IPD or an active device) comprises a height $H_{20}$ greater than a height $H_{10}$ of the cavity 91 such that the device 90 extends above the active side build-up interconnect structure 86, while the device 90 also remains recessed below the distal surface of bumps, balls, or interconnects 89. FIG. 2E, on the other hand, illustrates an instance in which the device 90 comprises a height $H_{20}$ less than a height $H_{10}$ of the cavity 91 such that the device 90 does not extend above the active side build-up interconnect structure 86, and is recessed below both the build-up interconnect structure 86, and is below the bumps, balls, or interconnects 89.

Figure 3A:
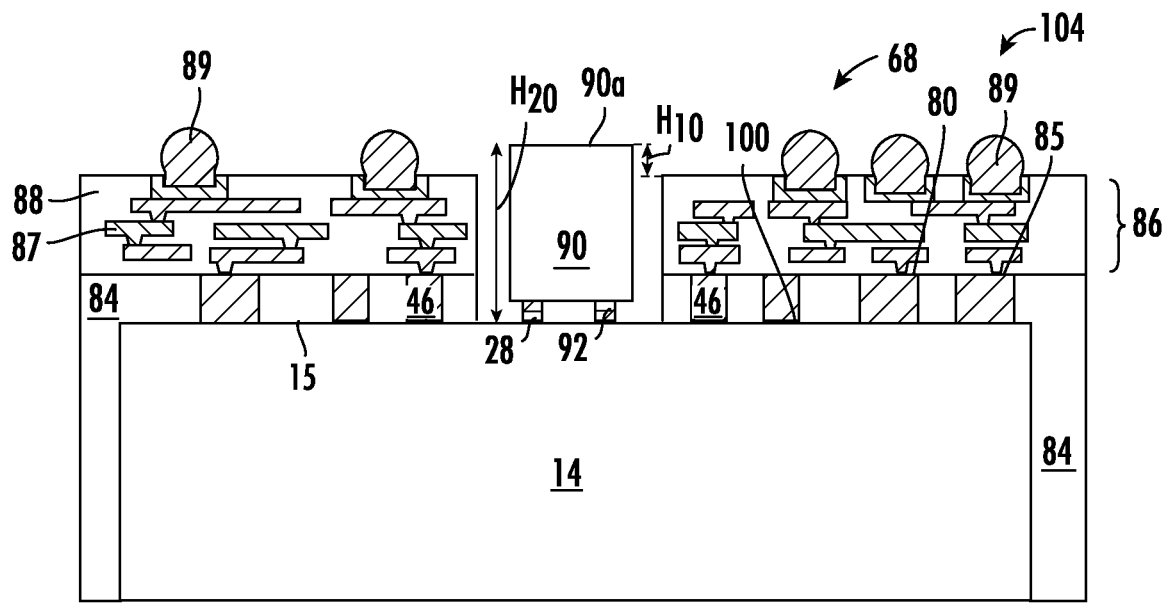
FIGS. 3A and 3B illustrate variations of fully molded semiconductor structures with face mounted passives.
Figure 3B:
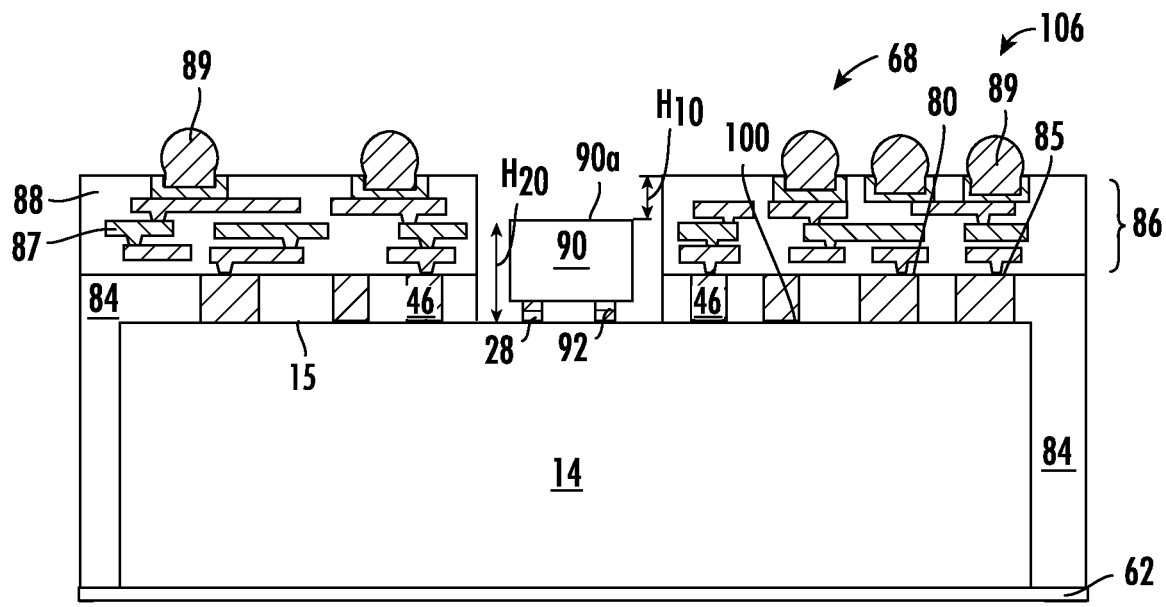

As illustrated in FIGS. 2D and 2E, the semiconductor devices or packages 100, 102 may be a package on package (PoP) structure. As illustrated in FIGS. 3A and 3B, the semiconductor devices or packages 104, 106 may be a self-contained or fully molded (M-series™) package and not a PoP structure. In either instance, the total height of device 90 may be in a range of about 90 μm-115 um for thinner versions, and may be in a range of 150 μm-600 um for thicker versions. Packages 104, 106 may further comprise a height of 7 um for the IPD studs 92 and, after solder paste and reflow, comprise a total height of 15 um that is added to the device 90. In instances of thinner versions, an attached height of the device 90 may increase by about 15 μm and therefore be in a range of about 105 μm-130 μm.

More specifically, in some embodiments the insulating layers 88, which may include three layers (or any suitable number of layers) may comprise a thickness of 7.5 μm each for a total of =22.5 μm (when three layers are present). Conductive layers 87, which may include three layers (or any suitable number of layers) may each comprise a thickness of 7 μm for a total of 21.0 μm, the PUBV with a thickness of 9 μm) for a total thickness of 52.5 μm. With a height of 115 μm for the device 90, the studs 46 would be greater than 62.5 μm (with the assumption of 72.5 μm for tolerance) and total cavity depth $H_{20}$ could be equal to 125 μm.

Figure 2F:
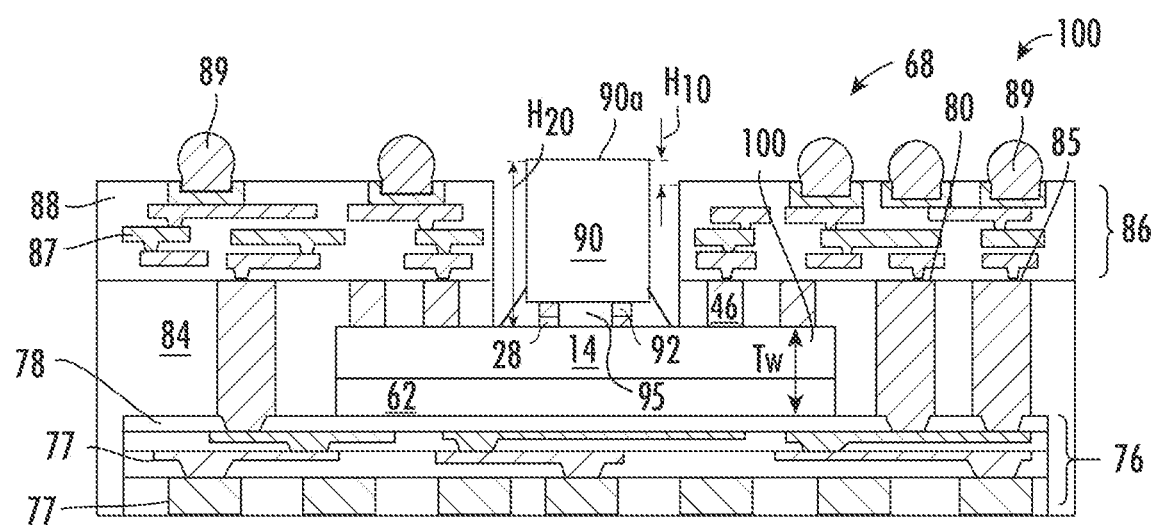

FIG. 2F, continuing from FIG. 2D, shows the PoP semiconductor device 100 from FIG. 2D with the temporary carrier 74 removed to expose at least a portion of a conductive layer 77 of the build-up interconnect structure 76 for subsequent PoP interconnect. Similarly, a person of ordinary skill in the art (POSA) will also understand that a completed PoP semiconductor device 102 from FIG. 2E will have its temporary carrier 74 removed. FIG. 2F illustrates an underfill 95 that may be disposed around the device 90 and in the device mount site 30 to provide structural support and environmental protection for the passive device 90.

FIGS. 3A and 3B, illustrate other non-POP instances in which the semiconductor devices or packages 104, 106 may comprise one or more devices 90 that may either be disposed below, or alternatively may extend above, the active side build-up interconnect structure 86, similar to FIGS. 2D and 2E, respectively. FIGS. 3A and 3B differ from FIGS. 2D and 2E, in that the devices illustrated in FIGS. 3A and 3B may not be PoP structures and may omit the backside build-up interconnect layer 76, as well as the posts, vertical package interconnects, or vertical device interconnects 80. As illustrated in FIGS. 3A and 3B, the device or packages 104, 106 may be self-contained or fully molded (M-series™) package and not PoP structures. In some instances, the device or packages 104, 106 may comprise a DAF formed over a backside of the device, as shown in FIG. 3A. In other instances, the device or packages 104, 106 may be formed without a DAF formed over a backside of the device, as shown in FIG. 3B.

As illustrated in FIG. 3A, a distal surface 90a of the device 90 extends above the active side build-up interconnect structure 86, but is recessed below the distal surface 89a of bumps 89. Alternatively, as illustrated in FIG. 3B, the device 90 is disposed with the distal surface 90a disposed below the surface of the active side build-up interconnect layer 86, by, e.g., thickening the build-up interconnect structure 86 (including thickening conductive layers 87 and insulting layers 88), thinning the device 90 (such as to a thickness of, or about, 60 µm), or both. The active side build-up interconnect structure 86 and cavity 91 may comprise suitable dimensions, such as those described above with respect to FIGS. 2D and 2E. A total cavity depth could be equal to, or about, 125 µm.

A number of advantages result from forming fully molded semiconductor structures 100, 102, 104, 106 with face mounted devices 90 directly attached to the semiconductor die 14, as described above. For example, electrically speaking the direct attachment of the device 90 to the semiconductor die 14 provides a lower contact resistance and a lower inductance. A low inductance is desirable for many applications, such as for a decoupling capacitor, and thus improved package performance results with the direct attachment of the device 90 as shown and described.

Figure 4A:
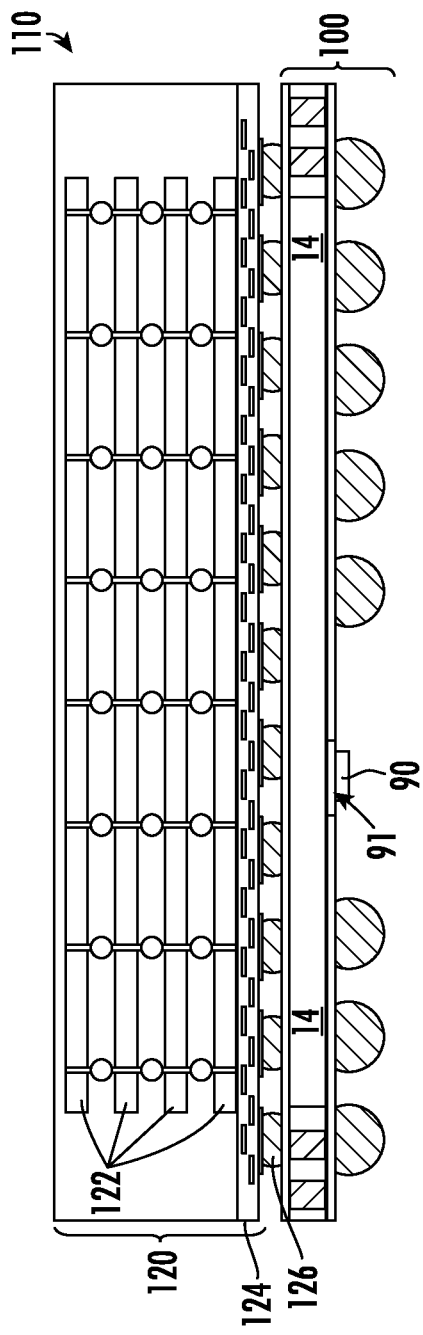
FIGS. 4A and 4B illustrate various arrangements and stacking of fully molded semiconductor structures with face mounted passives.
Figure 4B:
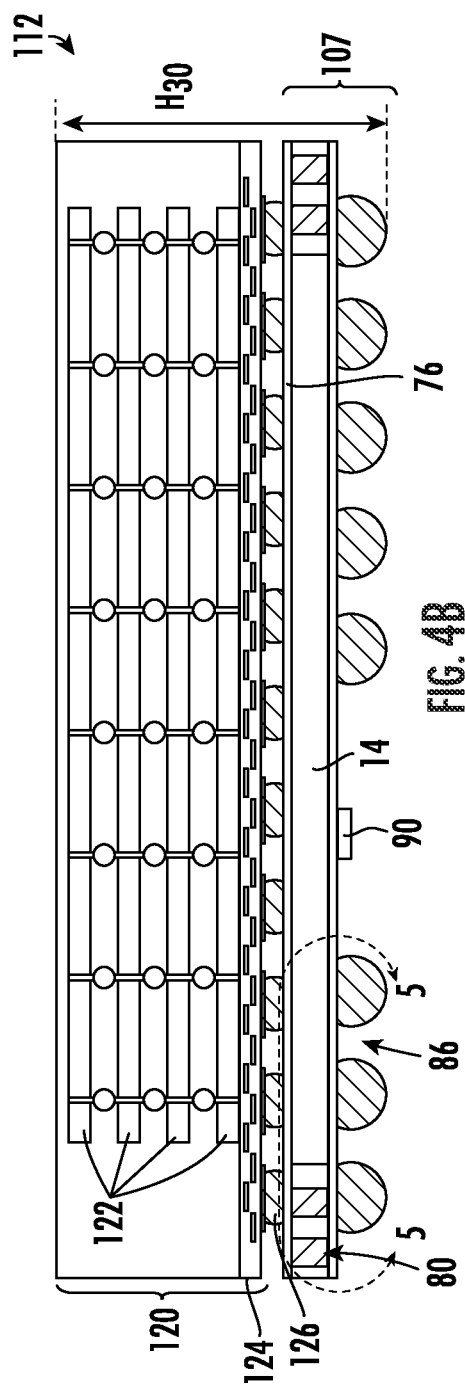

FIGS. 4A and 4B illustrate cross-sectional profile views of PoP semiconductor devices 110 and 112, respectively, that comprise additional structures, such as memory packages 120, coupled to and disposed above the PoP semiconductor devices (like semiconductor devices or packages 102 and 107). Accordingly, the PoP semiconductor devices 107, 110, and 112 may be advantageously used to incorporate face mounted devices 90 in a PoP arrangement with one or more memory die 122 as part of a larger memory package 110, 112. The memory package 120 may comprise combinational memory, comprising both volatile and non-volatile memory. The memory die 122 may comprise dynamic random-access memory (DRAM) die, synchronous dynamic random-access memory (SDRAM), and High Bandwidth Memory (HBM) die. The die 122 may be interconnected (such as with TSVs and bumps or microbumps) in a vertical stack of 2, 3, 4, 5, 7, 9, or any desirable number of memory die 122. The memory package 120 may also comprise electronic non-volatile computer memory storage, or flash memory, including NOR flash and NAND flash. FIG. 4A illustrates the face mounted device 90 attached directly to the semiconductor die or active device through conductive interconnects 28 and studs 92, within the cavity or passive mount site 91, such as after the removal of CFF 50.

In FIG. 4B, the face mounted device 90 (e.g., a MLCC), differs from the arrangement shown in FIGS. 4A and 2D-3B in that the face mounted device 90 is not shown attached directly to the semiconductor die 14 through the conductive interconnects 28 and studs 92, within the cavity or passive mount site 91. Instead, FIG. 4B illustrates a different or alternative arrangement in which the device 90 is not directly attached to semiconductor die 14, but instead is coupled to the semiconductor die 14 through the build-up interconnect structure 86, when the build-up interconnect structure 86 is formed over the semiconductor die 14, with the build-up interconnect structure 86 being disposed between the device 90 and the semiconductor die 14. As such, the build-up-interconnect structure 86 creates an offset between the build-up interconnect structure 86 and the semiconductor die 14. An overall height $H_{30}$ of the PoP package 110, 112 (or other similar PoP package) can be in a range of 600 um-1,300 µm, or about 1,140 µm.

Figure 5:
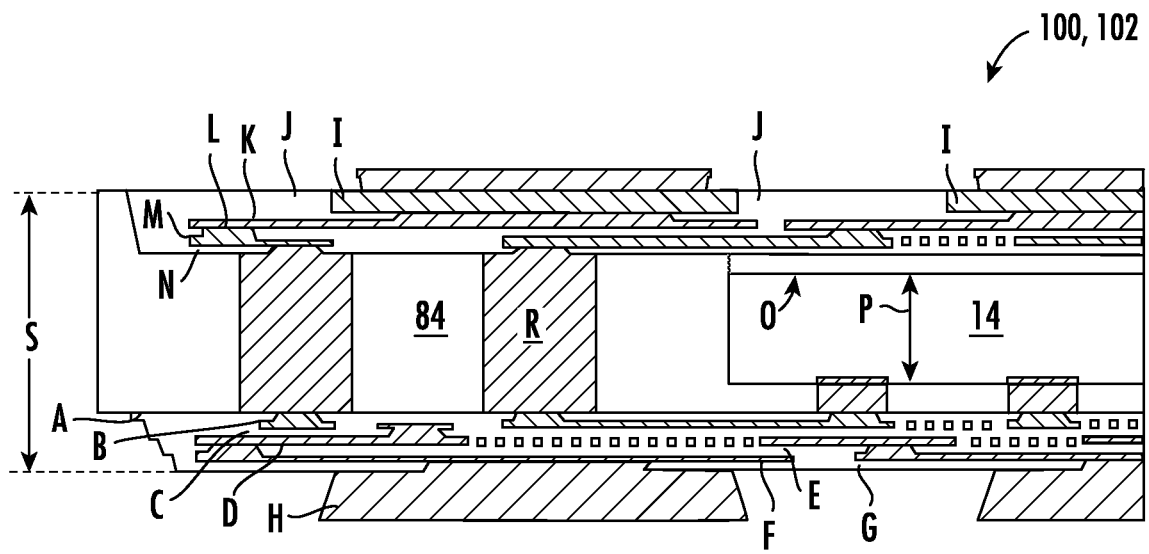
FIG. 5 provides exemplary dimensions for a fully molded semiconductor structures with face mounted passives.

FIG. 5, illustrates a close-up view of the portion of FIG. 4B shown within the section line 5-5. FIG. 5 further includes reference letters, for which a description, target or approximate target thicknesses are shown, together with notes for the reference letters are included in the FIG. 5D Table, which is included below. The same structure shown in FIG. 5C may exist whether: (i) the device 90 is directly attached to the semiconductor die 14 with interconnects 28, and studs 92, or (ii) the device 90 is coupled to the semiconductor die 14 through a build-up interconnect structure 86 or other structure that provides an offset, the build-up interconnect structure 86 being disposed between the device 90 and the build-up-interconnect structure 86.

TABLE

| | | FIG. 5D | |
|---|---|---|---|
| | Description | Target Thickness µm | Notes |
| A | DL1 (Dielectric Layer 1) | 5 | |
| B | Plated RDL 1 CU | 4 | |
| C | DL2 | 5 | As measured over RDL |
| D | Plated RDL 2 Cu | 4 | |
| E | DL3 | 5 | As measured over RDL 2 |
| F | Plated RDL 3 Cu | 4 | |
| G | DL4 (PI under UBM) | 5 | As measured over RDL 3 |
| H | Plated Cu UBM (motherboard) | 9 | |
| I | Plated Cu UBM (memory) | 9 | Post Grind min. |
| J | BRDL3 (backside RDL) | 5 | |
| K | BRDL2 | 4 | |
| L | BDL2 (backside dielectric or PI) | 5 | |
| M | BRDL 1 | 4 | |
| N | BDL1 (backside dielectric or PI) | 5 | |
| O | DAF | 10 | Die Attach Film |
| P | Die | 100 | After backgrind |
| Q | Cu Stud | 25 | |
| R | Cu Post | 135 | |
| S | Nominal Body | 202 | Not including UBM |

Figure 6A:
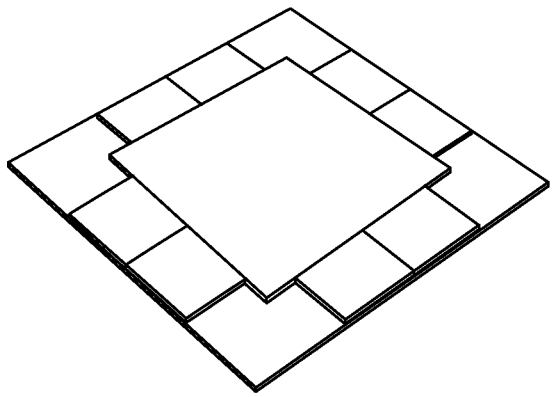
FIGS. 6A-6C illustrate fully molded semiconductor structures with face mounted passives in a chiplet arrangement, molded, and flip chip mounted to a substrate.
Figure 6B:
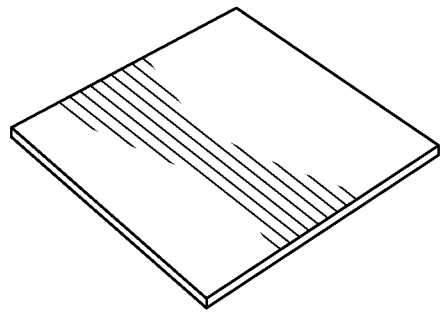
Figure 6C:
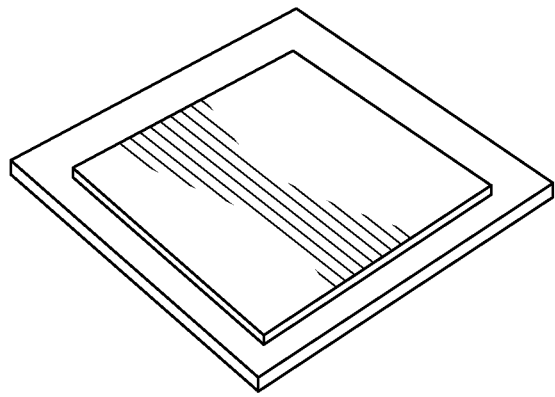

FIGS. 6A-6C, illustrate multiple semiconductor die joined together to form a chiplet or a grouping of multiple semiconductor die. The grouping of multiple semiconductor die may also comprise fully molded semiconductor structures with face mounted passives. FIG. 6A illustrates a chiplet with multiple semiconductor die or a system on a chip (SoC). FIG. 6B illustrates the arrangement of die from FIG. 6A, but overmolded with encapsulant material and with the semiconductor devices arranged in a fan-out configuration. FIG. 6C illustrates the arrangement of FIG. 6B, but with the semiconductor die coupled to, or disposed over (or placed on) a substrate, which may be further coupled to, or mounted on, a motherboard, a printed circuit board (PCB), an interposer, or another semiconductor device or package.

The method and device described herein may be advantageously used for applications in which the device is mounted to a substrate, and also for instances in which it is not mounted to a substrate, like for applications within a handheld mobile electronic device, such as a smartphone. As shown in FIG. 6A, the chiplet may comprise multiple semiconductor die (in this case 9 semiconductor die), or any other suitable or desirable number of die. A type of the semiconductor die 14 or chips may vary according to the configuration or design of the chiplet or final device design, and may comprise a central processing unit (CPU), a modem, a graphics processing unit (GPU), chips, semiconductor die, or processors specialized for running artificial intelligence (AI) algorithms, chips, semiconductor die or processors specialized for input/output (I/O), Serializer/Deserializer (SERDES) devices, and various other memory devices such as chips or semiconductor die specialized for Cache or storing data, and chips specialized for high bandwidth memory (HBM) or high-speed computer memory.

As described herein, the various conductive materials, layers, and structures, including the conductive studs, copper studs, or both, as well as conductive interconnects, copper interconnects, or both, conductive posts, copper posts, or both may be formed using a patterning and metal deposition processes such as printing, PVD, CVD, sputtering, electrolytic plating, electroless plating, metal evaporation, metal sputtering, or other suitable metal deposition process. Interconnect structures may be one or more layers of Al, Cu, Sn, Ni, Au, Ag, palladium (Pd), or other suitable electrically conductive material and can include one or more UBM layers.

Similarly, the build-up interconnect structures may be formed to electrically connect, and provide routing between and among, the conductive studs, copper studs, conductive interconnects, copper interconnects, conductive posts, copper posts, and the semiconductor die. The build-up interconnect structure may comprise a single conductive layer or routing layer, or any desirable number of layers may be used depending on the configuration and design of the semiconductor device. The build-up interconnect structure can optionally comprise one or more insulating, passivating, or dielectric layers, including layers above, below, or both above and below one or more (including all) of the conductive layers and routing layers of the build-up-interconnect structure. The dielectric or insulating layer(s) can comprise one or more layers of polymer, polyimide, $SiO_2$, $Si_3N_4$, SiON, $Ta_2O_5$, $Al_2O_3$, or other material having similar insulating and structural properties. The insulating layer can be formed using PVD, CVD, printing, spin coating, spray coating, sintering or thermal oxidation. Openings or conductive vias may also be formed through the insulating layer for access to conductive layers, such as by photo patterning, laser ablating, or other suitable way, such that a via or electrical connection contacts or is electrically coupled through the dielectric or insulating layer to allow connection to other conductive layers, interconnect layers, or features.

One or more conductive layers or RDLs may be formed and may be one or more layers of Al, Cu, Sn, Ni, Au, Ag, or other suitable electrically conductive material formed using a patterning and metal deposition process such as sputtering, electrolytic plating, and electroless plating, or other suitable process. Conductive pads, contact pads, or UBMs may also be formed over, or as part of, the build-up interconnect structure.

While this disclosure includes a number of embodiments in different forms, the drawings and written descriptions present detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A semiconductor device, comprising:
   a semiconductor die disposed over a first build-up interconnect structure with copper posts disposed around a perimeter of the semiconductor die;
   a plurality of copper studs formed over an active surface of the semiconductor die, the plurality of copper studs being disposed around a passive mount site, wherein the passive mount site comprises copper interconnects comprising a height less than a height of the plurality of copper studs;
   encapsulant disposed around the copper posts, the semiconductor die, and the copper studs, wherein a portion of the copper posts and the copper studs are exposed from the encapsulant at a planar surface;
   a second build-up interconnect structure comprising one or more redistribution layers disposed over and coupled to the planar surface, the copper posts, and the copper studs;
   electrical interconnects coupled to the second build-up interconnect structure; and
   a passive device coupled to the copper interconnects of the passive mount site within a cavity, wherein the passive device and the copper interconnects of the passive device are exposed with respect to the encapsulant.

2. The semiconductor device of claim 1, wherein the semiconductor die comprises a plurality of semiconductor die in a chiplet arrangement, the chiplet further comprising semiconductor die comprising one or more of: a CPU, a modem, a GPU, AI processor, TO devices, SERDES devices, and a memory device.

3. The semiconductor device of claim 1, wherein:
   the copper interconnects comprise a height in a range of 2 to 20 micrometers; and
   the copper studs comprise a height in a range of 5 to 300 micrometers.

4. The semiconductor device of claim 1, wherein a footprint of the plurality of copper studs surrounds the passive mount site.

5. The semiconductor device of claim 1, wherein forming the copper interconnects further comprises forming one or more bump, ball, flip chip structure, or copper pillar bump comprising one or more of solder, solderless material, polymer conductive film, and carbon.

6. The semiconductor device of claim 1 wherein the passive device further comprises an integrated passive, resistor, capacitor, inductor, integrated passive device (IPD), multilayer ceramic capacitor (MLCC), semiconductor die, or a voltage regulator.

7. The semiconductor device of claim 1, wherein the passive device is directly attached to the copper interconnects of the passive mount site.

8. A semiconductor device, comprising:
   a plurality of conductive studs formed over an active surface of a semiconductor die, the plurality of conductive studs being disposed around a device mount site, wherein the device mount site comprises conductive interconnects comprising a height less than a height of the plurality of conductive studs;

encapsulant disposed around the semiconductor die and the conductive studs, wherein a portion of the conductive studs is exposed from the encapsulant at a planar surface;

a build-up interconnect structure comprising one or more layers disposed over and coupled to the planar surface, the conductive studs, and the conductive interconnects; and a device within a cavity coupled to the conductive interconnects of the device mount site.

9. The semiconductor device of claim 8, wherein the semiconductor die comprises a plurality of semiconductor die in a chiplet arrangement, the chiplet further comprising semiconductor die comprising one or more of: a CPU, a modem, a GPU, AI processor, IO devices, SERDES devices, and a memory device.

10. The semiconductor device of claim 8, wherein:
the conductive interconnects comprise a height in a range of 2 to 20 micrometers; and
the conductive studs comprise a height in a range of 5 to 300 micrometers.

11. The semiconductor device of claim 8, further comprising an underfill disposed around the device and in the device mount site to provide structural support and environmental protection for the device.

12. The semiconductor device of claim 8, wherein a footprint of the plurality of conductive studs surrounds the device mount site.

13. The semiconductor device of claim 8, wherein forming the conductive interconnects further comprises forming one or more bump, ball, flip chip structure, or conductive pillar bump comprising one or more of solder, solderless material, polymer conductive film, and carbon.

14. The semiconductor device of claim 8 wherein the device further comprises an integrated passive, resistor, capacitor, inductor, integrated passive device (IPD), a multilayer ceramic capacitor (MLCC), a semiconductor die, or a voltage regulator.

15. The semiconductor device of claim 8, wherein the device is directly attached to the conductive interconnects of the device mount site.

16. A semiconductor device, comprising:
a plurality of conductive studs formed over an active surface of a semiconductor die, the plurality of conductive studs being disposed around a device mount site, wherein the device mount site comprises conductive interconnects comprising a height less than a height of the plurality of conductive studs;

encapsulant disposed around the semiconductor die and the conductive studs, wherein a portion of the conductive studs is exposed from the encapsulant;

a build-up interconnect structure comprising one or more conductive layers disposed over and coupled to the conductive studs;

electrical interconnects coupled to the build-up interconnect structure; and a device coupled to the conductive interconnects of the device mount site within a cavity.

17. The semiconductor device of claim 16, wherein the semiconductor die comprises a plurality of semiconductor die in a chiplet arrangement, the chiplet further comprising semiconductor die comprising one or more of: a CPU, a modem, a GPU, AI processor, TO devices, SERDES devices, and a memory device.

18. The semiconductor device of claim 16, wherein:
the conductive interconnects comprise a height in a range of 2 to 20 micrometers; and
the conductive studs comprise a height in a range of 5 to 300 micrometers;
wherein a footprint of the plurality of conductive studs surrounds the device mount site.

19. The semiconductor device of claim 16 wherein the device further comprises an integrated passive, resistor, capacitor, inductor, integrated passive device (IPD), or a multilayer ceramic capacitor (MLCC), a semiconductor die or a voltage regulator.

20. The semiconductor device of claim 16, wherein the device is directly attached to the conductive interconnects of the device mount site.

* * * * *

UNITED STATES PATENT AND TRADEMARK OFFICE
CERTIFICATE OF CORRECTION

PATENT NO. : 11,444,051 B2
APPLICATION NO. : 17/532475
DATED : September 13, 2022
INVENTOR(S) : Clifford Sandstrom et al.

Page 1 of 1

It is certified that error appears in the above-identified patent and that said Letters Patent is hereby corrected as shown below:

In the Claims

In Claim 2, Column 18, Line 38, 'TO devices' should read -- IO devices --.

In Claim 17, Column 20, Line 22, 'TO device' should read -- IO devices --.

Signed and Sealed this
Tenth Day of January, 2023

Katherine Kelly Vidal
*Director of the United States Patent and Trademark Office*